United States Patent [19]
Young

[11] Patent Number: 4,613,772
[45] Date of Patent: Sep. 23, 1986

[54] CURRENT COMPENSATION FOR LOGIC GATES

[75] Inventor: W. Ronald Young, Palm Bay, Fla.

[73] Assignee: Harris Corporation, Melbourne, Fla.

[21] Appl. No.: 598,985

[22] Filed: Apr. 11, 1984

[51] Int. Cl.[4] ................ H03K 19/003; H03K 19/094; H03K 19/20

[52] U.S. Cl. .................................. 307/443; 307/448; 307/451; 307/491; 307/297

[58] Field of Search ................... 307/200 B, 443, 445, 307/448, 450, 451–453, 491, 555, 577, 579, 584, 585, 297; 330/261

[56] References Cited

U.S. PATENT DOCUMENTS

| | | | |
|---|---|---|---|
| 3,898,477 | 8/1975 | Buchanan | 307/448 |
| 3,943,377 | 3/1976 | Suzuki | 307/443 X |
| 3,982,138 | 9/1976 | Luisi et al. | 307/452 X |
| 3,989,955 | 11/1976 | Suzuki | 307/452 |
| 4,242,604 | 12/1980 | Smith | 307/443 |
| 4,417,160 | 11/1983 | Schade, Jr. | 307/491 X |

FOREIGN PATENT DOCUMENTS

| | | | |
|---|---|---|---|
| 2549308 | 7/1976 | Fed. Rep. of Germany | 307/443 |
| 115038 | 9/1981 | Japan | 307/452 |
| 2438 | 1/1984 | Japan | 307/452 |
| 664297 | 5/1979 | U.S.S.R. | 307/443 |

Primary Examiner—Larry N. Anagnos
Attorney, Agent, or Firm—Barnes & Thornburg

[57] ABSTRACT

Current compensation for inverting logic gates is achieved by using a current mirror having a controlling leg equivalent to the input structure of the logic gate which is in the controlled leg. The controlling leg receives a reference voltage signal equal to the input signal to the logic gate which creates a leakage current. A plurality of controlled legs can be used with a single controlling leg to provide current compensation for a plurality of logic gates.

34 Claims, 8 Drawing Figures

| Vi31 | Vi30 | Vi32 | Vo30 |
|------|------|------|------|
| L | L | X | H |
| X | X | L | H |
| X | H | H | L |
| H | X | H | L |

CURRENT COMPENSATION FOR LOGIC GATES

BACKGROUND AND SUMMARY OF THE INVENTION

The present invention relates generally to logic gates and more specifically to an improved current compensated logic gate.

Logic gates of the prior art are generally one of a series of logic gates receiving a plurality of logic signals from a previous logic gate which also has a plurality of inputs. Logic gates, for example, NOR and NAND, use a plurality of parallel connected input devices connected between a first supply voltage and an output and a pull-up or pull-down device respectively connected between the output and a second supply voltage. In a NOR/NOR or a NAND/NAND structure, activation of one of the input devices in the first stage will not produce a pure logic signal which represents an off signal to the second stage because of the voltage divider action between the on input device and the pull-up or pull-down device. Thus, the input device in the second stage is not completely off and thus developes a leakage current. This reduces the output logic voltage swing between logic high and logic low of the second stage.

The NOR gate and NAND gate may also be formed using a plurality of serial connected input devices connected between a first supply voltage and an output and a pull-down or a pull-up device, respectively, connected between the output and a second supply voltage. As in the parallel connected NOR or NAND gate, activation of one of the serial connected input devices and not total activation of a second serial connected device or not total deactivation of all the serial input devices forms the same voltage divider with the pull-up or pull-down device to create a leakage current which effects the subsequent stage or provides an undesirable output at the final stage. This problem is associated with any complex inverting logic which includes either parallel or serial connected input devices as well as combinations thereof which can produce a leakage current if they are not fully off.

With field effect transistors which operate in the enhancement mode, leakage current will also exist at high temperatures when the threshold goes through zero and they become operable in the depletion mode.

In order to maintain as large as possible voltage swing between the logic high and logic low signals, current compensation must be provided at the output of the second logic stage.

An object of the present invention is to provide a unique current compensation scheme for the output of a NOR or NAND gate.

Another object of the present invention is to provide a current compensation scheme for a logic array of NAND or NOR gates using the minimum number of devices.

Still another object of the present invention is to provide a current compensation scheme for a NAND or NOR gate which tracks the temperature and process variations of the logic gate.

An even further object of the present invention is to provide a current compensation circuit which accommodates leakage current resulting from high temperature depletion mode operation of field effect transistor elements.

A still even further object of the present invention is to provide current compensation for a complementary inverting logic gate.

These and other objects of the invention are attained by providing a current compensation generator having the same current capacity as the input devices of the inverting logic gate and a drive signal equivalent to the less than fully off drive signal provided by an input from a previous logic stage to generate the appropriate compensation current. The current compensation device includes a current mirror wherein the input devices of the inverting logic gate are in the controlled leg and a plurality of control devices equivalent in current capacity to those of the logic input devices are provided in the controlling leg. A voltage reference generator, having the same structure as a first logic gate stage with one input on, drives the control load devices in the controlling leg. To provide compensation for the high temperature range wherein the field effect transistors which make up the logic gate go into the depletion mode, the reference voltage would be the fully off logic signal which is generally one of the voltage source signals. Thus, the compensation circuit becomes active only in the depletion mode as does the logic gate. The first and second logic gate may be NOR/NOR or NAND/NAND.

For a logic array having a plurality of second stage logic gates, a plurality of controlled legs are connected in parallel to a single controlling leg having a single reference generator. The control devices and the input devices of the second input stage may be of identical current capacity and of the same number. Alternatively, the control load devices and the input devices of the logic gate may have the same current capacity and the ratio of the current capacity of the drive device in the controlling leg to the drive device in each of the controlled legs is equal to the ratio of the number of control load devices to the number of input devices of the respective logic gates. This allows a single controlling leg to control a plurality of logic gates having different total current capacities and consequently different current compensation requirements.

Other objects, advantages and novel features of the present invention will become apparent from the following detailed description of the invention when considered in conjunction with the accompanying drawings.

DETAILED DESCRIPTION OF THE INVENTION

Figure 1:
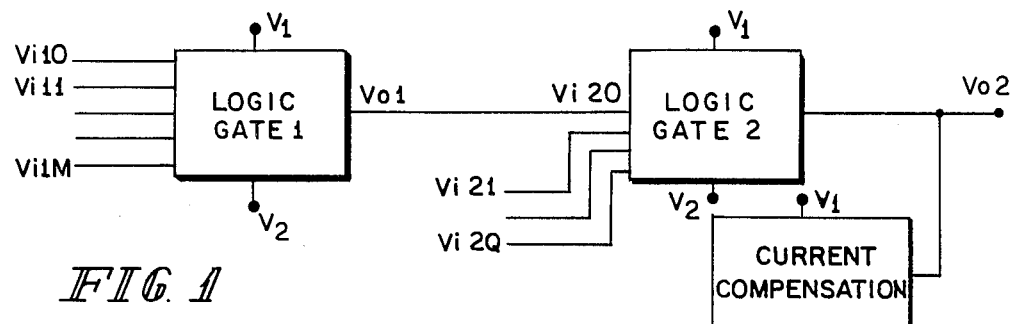
FIG. 1 is a block diagram of two stages of logic incorporating the principles of the present invention.

A multi-stage logic circuit is illustrated in FIG. 1 as including logic gate 1 and logic gate 2. Logic gate 1 has a plurality of inputs $V_{i1O}$ through $V_{i1M}$ and an output $V_{01}$. Logic gate 2 has a plurality of inputs $V_{i2O}$ through $V_{i2Q}$ and a single output $V_{02}$. A current compensation circuit is connected to the output of the logic gate 2. Logic gate 1, logic gate 2 and current compensation means are connected to the two voltage sources of $V_1$ and $V_2$. The current compensation circuit provides compensation for the leakage current of the logic gate 2 produced by all of the inputs to the logic gate 2 being at a logic level less than a full logic off input such that the input devices in logic gate 2 produce leakage current.

Figure 2:
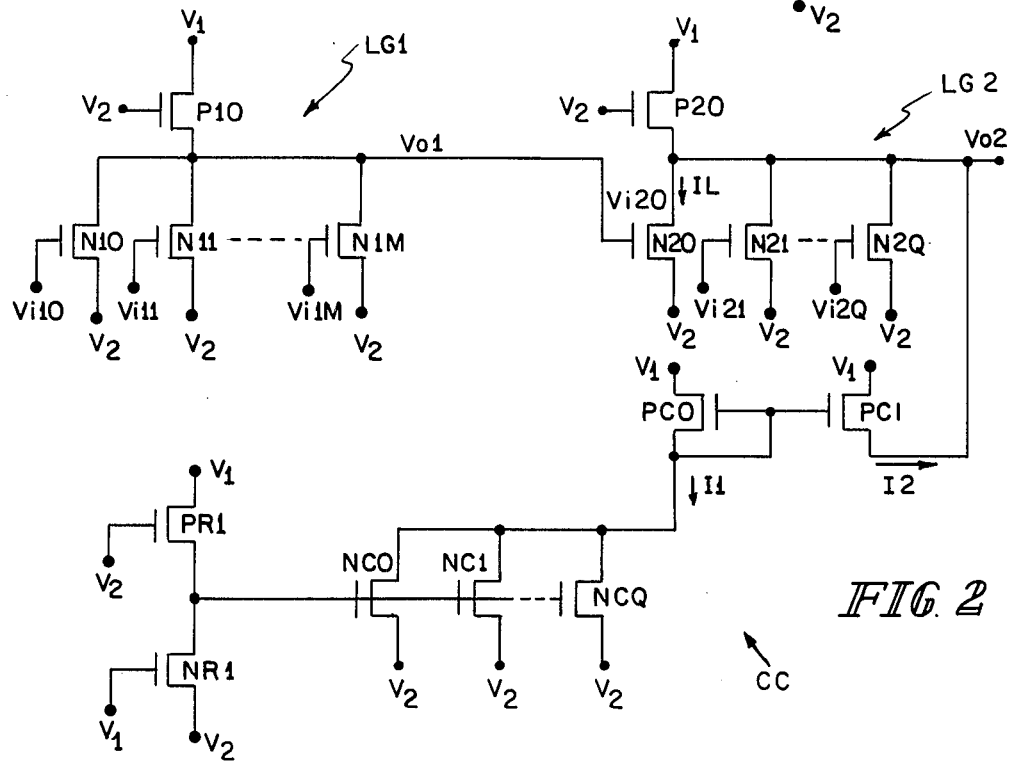
FIG. 2 is a schematic of two levels of NOR logic incorporating the principles of the present invention.

A schematic for the block diagram of FIG. 1 wherein the first and second logic gates are both NOR gates is illustrated in FIG. 2. The first logic gate LG1 includes a pull-up device $P_{10}$ connected between the output terminal $V_{01}$ and the first voltage source $V_1$ and its gate connected to the second source $V_2$ or any other voltage source so as to be continuously on. The pull-up device $P_{10}$ pulls up the output $V_{01}$ to the voltage $V_1$ minus a single voltage drop across the P-channel device. Logic gate LG1 includes a plurality of input devices $N_{10}$ through $N_{1M}$ connected in parallel between the output terminal $V_{01}$ and the second voltage source $V_2$. Each of the gates are connected to a respective input terminal $V_{i1O}$ through $V_{i1M}$. The output voltage $V_{01}$ is equal to the first voltage source $V_1$ minus a single voltage drop across $P_{10}$ when all of the input signals to the N-channel devices are low. The voltage drop across $P_{10}$ is caused by the leakage current flowing in the N-channel devices. When any of the inputs to the N-channel devices are a high, one of the N-channel input devices is activated thereby pulling the output voltage $V_{01}$ to the second voltage source $V_2$ plus a single voltage drop across the N-channel device because of the voltage divider formed by the on-resistances of $P_{10}$ and one of the input devices $N_{1X}$.

The NOR gate of logic gate LG2 includes a pull-up device $P_{20}$ connected between the output terminal $V_{02}$ and the first voltage supply $V_1$ with its gate connected to the second voltage supply $V_2$ or any other voltage source so as to be continuously on. A plurality of N-channel input devices $N_{20}$ through $N_{2Q}$ are connected in parallel between the output $V_{02}$ and the second voltage supply $V_2$ and have their gates connected to respective inputs $V_{i2O}$ through $V_{i2Q}$ of the logic gate LG2. The first input $V_{i2O}$ is connected to the output $V_{01}$ of the first logic gate. As with logic gate LG1, the NOR gate of logic gate LG2 provides an output signal at $V_{02}$ of the $V_1$ minus a single P-channel voltage drop when there are no logic high input signals on the input terminals $V_{i2O}$ through $V_{i2Q}$. The voltage drop across $P_{10}$ is caused by the leakage current flowing in the N-channel devices.

As discussed with respect to logic gate LG1, the output voltage $V_{01}$ may not be a true logic 0 so as to maintain the input device $N_{20}$ completely off. The voltage $V_{01}$ may slightly exceed the threshold value of $N_{20}$ such that it is not completely off and therefore it begins to draw current. This small current is the leakage current $I_L$ which will reduce the voltage difference between the logic high and the logic low at $V_{02}$. As more and more input devices are used, the leakage current accumulates and substantially decreases the voltage swing.

To compensate for this leakage current $I_L$, the current compensation circuit CC is provided. The circuit includes a reference voltage generator including device $P_{R1}$ and $N_{R1}$. The P-channel device $P_{R1}$ is connected between the first voltage source $V_1$ and an output terminal $V_{REF}$ and has its gate connected to the second voltage source $V_2$ or the same voltage as the gate of $P_{10}$ and the N-channel device $N_{R1}$ is connected between second voltage source $V_2$ and the output $V_{REF}$ and has its gate connected to the first voltage source $V_1$. P-channel device $P_{R1}$ and N-channel device $N_{R1}$ have the same current capacity as $P_{10}$ and any one of the input transistors $N_{10}$ through $N_{1M}$ of the first logic gate LG1. Thus, the signal $V_{REF}$ is the same voltage as $V_{01}$ if one of the input devices is on.

The current compensating generator includes a current mirror having common gate connected drive devices $P_{C0}$ and $P_{C1}$. The controlling drive device $P_{C0}$ has its gate connected to its drain and its source connected to $V_1$. The controlled leg drive device $P_{C1}$ has its source connected to $V_1$ and its drain connected to the output terminal $V_{02}$ of the second logic gate LG2. The purpose of the current mirror of the current compensation generator CC is to produce a current $I_1$ equal to $I_2$ which will compensate for the leakage current produced by the input devices $N_{20}$ through $N_{2Q}$ of the second logic gate LG2. The controlled leg of the current mirror includes the drive device $P_{C1}$ and the parallel connected input devices $N_{20}$ through $N_{2Q}$ as load elements of the controlled leg and the controlling leg includes drive device $P_{C0}$ and N-channel devices $N_{C0}$ through $N_{CQ}$ as load element. The control devices $N_{C0}$ through $N_{CQ}$ are connected in parallel between the source of the drive device $P_{C0}$ and the voltage source $V_2$. The gates of the controlled N-channel devices are connected to $V_{REF}$. Thus, each of the parallel connected control devices receives the same input signal as the input devices of the logic gate LG2.

The drive devices $P_{C0}$ and $P_{C1}$ have the same current capacity and the control devices $N_{C0}$ through $N_{CQ}$ have the same current capacity as the input devices $N_{20}$ and $N_{2Q}$ of the second logic gate LG2. Thus, the current $I_2$ matches current $I_1$ and provides a compensation current equivalent to the sum of all the leakage currents of the input devices $N_0$ through $N_{2Q}$. Since the drive devices $P_{C0}$ and $P_{C1}$ are of equal current capacity, and the control load devices $N_{C0}$ to $N_{CQ}$ and the input devices $N_{20}$ through $N_{2Q}$ are of the same current capacity and built during the same process, both legs of the current mirror will track for supply voltage, temperature and process variations.

Figure 3:
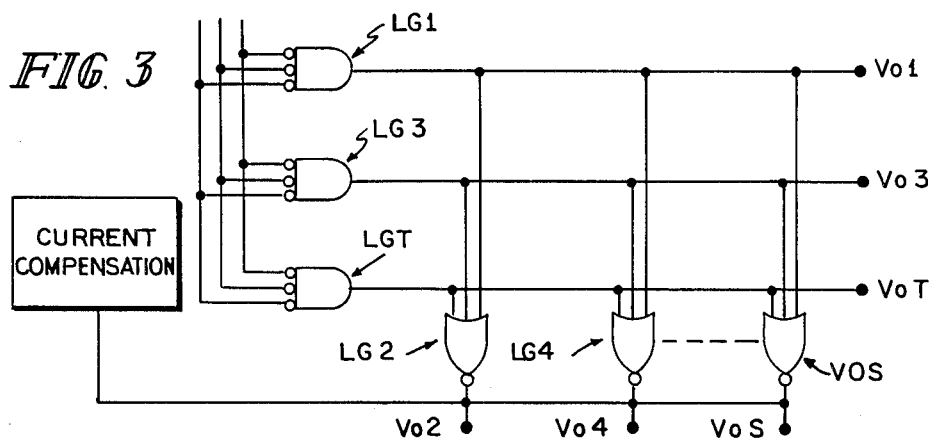
FIG. 3 is a schematic of a NOR/NOR logic array incorporating the principles of the present invention.

FIG. 3 illustrates a logic array having input NOR gates LG1, LG3 through LGT with their inputs connected to a plurality of input lines and providing an output which are connected a plurality of inputs to output NOR gates LG2, LG4 through LGS. The current compensating circuit CC is connected to the output of each of the output logic gates LG2, LG4 through LGS. In the array, the NOR gates LG1–LGT form the AND plane and the output OR gates LG2–LGS form the OR plane. The array may be a programmable logic array (PLA) or a programmable array logic (PAL) or any other AND/OR matrix.

Figure 4:
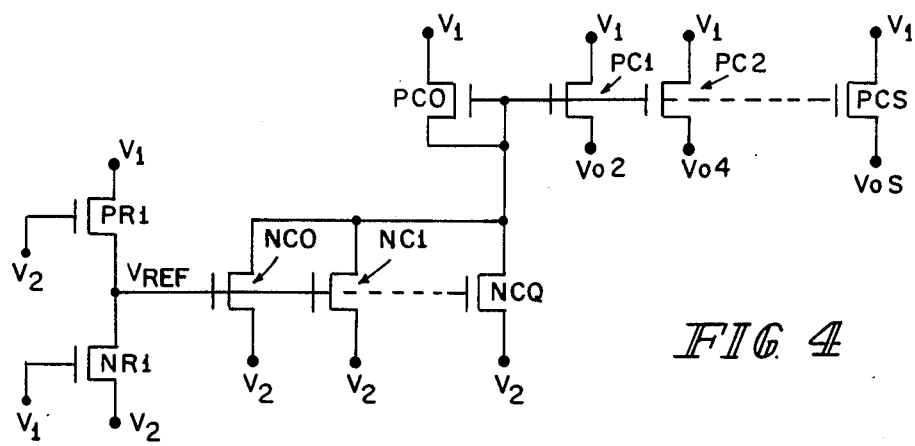
FIG. 4 is a schematic of a NOR/NOR current compensation device for a plurality of logic gates incorporating the principles of the present invention.

The control logic CC for FIG. 3 is illustrated in FIG. 4 with the elements which are common to FIG. 2 having the same reference numbers. The reference voltage generator includes the same two devices $P_{R1}$ and $N_{R1}$ to provide the reference signal $V_{REF}$. The current mirror includes in the controlling leg drive device $P_{C0}$ having load control devices $N_{C0}$ through $N_{CQ}$. This is also the same as FIG. 2. The controlled legs include a plurality of P-channel drive devices $P_{C1}$ through $P_{C2}$ having their gates connected to the common gate of the controlling leg drive device $P_{C0}$, their sources connected to the reference voltage $V_1$ and their drains connected to a respective output of a respective NOR gate $V_{02}$, $V_{04}$ through $V_{0S}$. Thus, it can be seen that only one reference voltage generator and one controlling leg may be used to provide a plurality of parallel current mirrors to control a plurality of logic gates and provide current compensation.

If the number of input gates in the output logic gates is different than that of the number of control load devices, the current capacity of the controlled drive device $P_{C1}$ through $P_{CM}$ may be proportioned to provide the appropriate compensation current. To be more specific, the ratio of the current capacity of the drive device $P_{C0}$ in the controlling leg to the current capacity of a drive device in the control leg is equal to the ratio of the number of control load devices $N_{CO}$ through $N_{CQ}$ to the number of input devices of the respective logic gate. For example, if the OR gate only has five inputs and there are ten load devices in the current compensation circuit, then the control drive device $P_{C0}$ would have twice the current capacity of the controlled drive device $P_{CS}$ for that output NOR gate. Thus, a single structure controlling leg can be used with a plurality of different structure output logic gates.

Figure 5:
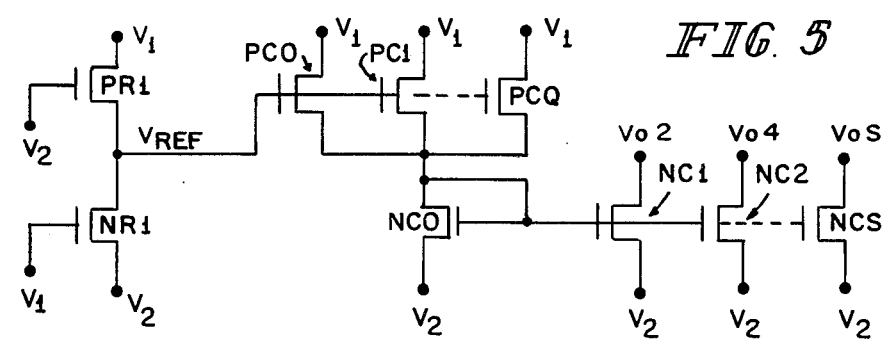
FIG. 5 is a schematic of a NAND/NAND current compensation means for a plurality of logic gates incorporating the principles of the present invention.

Although the present invention has been described using NOR/NOR logic gates, the principles also applicable to NAND/NAND gate structure. In such a case, the current compensation circuit would include the appropriate reversal of conductivity type of devices. This is illustrated in FIG. 5 wherein the input voltage reference generator includes the same structure having devices $P_{R1}$ and $N_{R1}$ to produce the reference voltage $V_{REF}$. Since a NAND gate structure which will form the load devices of the controlled leg includes a plurality of parallel connected P-channel devices, the load devices of the controlling leg includes a plurality of parallel connected P-channel devices $P_{CO}$ through $P_{CQ}$ having their gates connected to the reference signal $V_{REF}$, their sources connected to the reference voltage $V_1$ and their drains connected together to a drive device $N_{CO}$. The drive devices for the current mirror includes the controlling leg drive device $N_{C0}$ having its source connected to $V_2$ and its gate and drain connected to the common connected load devices $P_{CO}$ through $P_{CQ}$. The controlled legs of the current mirror includes a plurality of N-channel devices $N_{C1}$ through $N_{CS}$ having their gates connected in common with the gate of the controlling leg drive device $N_{C0}$, their sources connected to reference voltage source $V_2$ and their drains connected to a respective NAND gate output $V_{02}$ through $V_{0S}$. The same design criteria with respect to the current capacity of the drive devices of the controlled legs of FIG. 4 apply to FIG. 5.

Figure 6A:
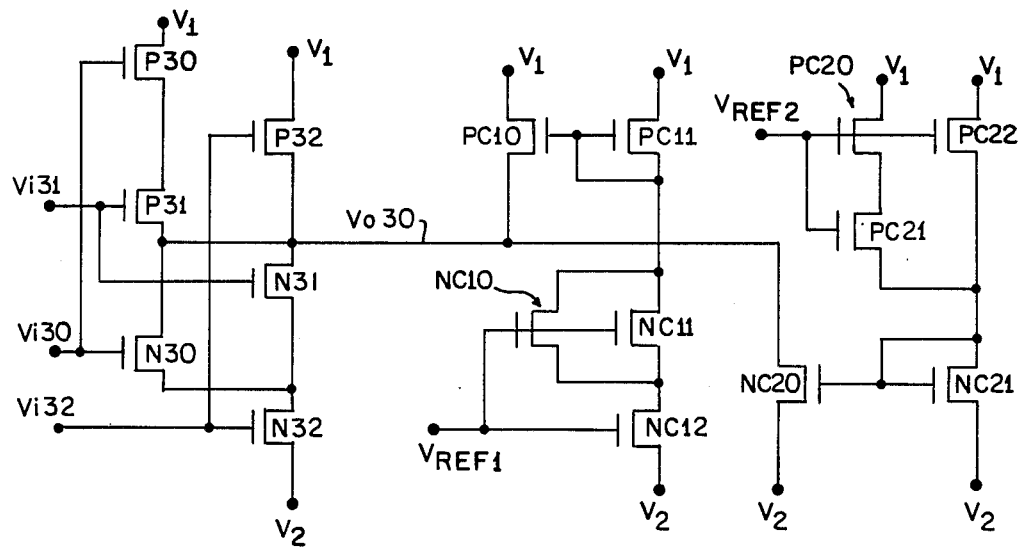
FIGS. 6A and 6B show a schematic and truth table for a complex logic gate incorporating the principles of the present invention.

The compensation network of the prior figures are specifically designed for compensating the leakage current of a plurality of parallel connected input devices. The principle is also applicable to serial connected input devices as illustrated for the complex logic in FIG. 6A. The complex logic has three inputs $V_{i30}$, $V_{i31}$ and $V_{i32}$ and an output $V_{O30}$. A pair of P-channel devices $P_{30}$ and $P_{31}$ are connected in series between the voltage source $V_1$ and the output terminal $V_{O30}$ and their gates connected respectively to the input voltages $V_{i30}$ and $V_{i31}$, respectively. P-channel device $P_{32}$ is connected in series between the voltage source $V_1$ and the output terminal $V_{O30}$ and has its gate connected to the input $V_{i32}$. N-channel devices $N_{30}$ and $N_{31}$ are connected in parallel between the output terminal $V_{O31}$ and the drain of N-channel device $N_{32}$ which has its source connected to the voltage source $V_2$. The gates of N-channel device $N_{30}$, $N_{31}$ and $N_{32}$ are connected respectively to input terminals $V_{i30}$, $V_{i31}$ and $V_{i32}$.

The truth table of FIG. 6 indicate that for low inputs on $V_{i30}$ and $V_{i31}$ or for a low input and $V_{i32}$, the output $V_{O30}$ is high. For high inputs on $V_{i30}$ and $V_{i32}$ or for high inputs on $V_{i31}$ and $V_{i32}$, the output $V_{O30}$ is low. For any combination of input signals, the appropriate P or N-channel device may not be fully off and thus provide leakage current. For example, if the input $V_{i32}$ is not high enough to keep $P_{32}$ fully off, it will provide leakage current when $N_{32}$ and either $N_{30}$ or $N_{31}$ are on so as to form the appropriate voltage divider. To compensate for leakage current produced by any or all of the N-channel devices or any and all of the P-channel devices, a pair of compensation circuits are provided.

The first compensation circuit for all of the N-channel devices not being fully off includes a first current mirror which includes controlled leg drive device $P_{C10}$ connected between the voltage source $V_1$ and the output terminal $V_{O30}$ and a controlling leg drive device $P_{C11}$ having its source connected to the voltage source $V_1$ and its gate and drain connected to the equivalent circuit of the N-channel logic input devices. The equivalent circuit includes N-channel devices $N_{C10}$ and $N_{C11}$ connected in parallel with their drains connected to the drain of $P_{C11}$ and their sources connected to the drain of $N_{C12}$ which has its source connected to voltage source $V_2$. The gates of the load devices $N_{C10}$, $N_{C11}$ and $N_{C12}$ are connected to a first reference voltage $V_{REF1}$. The configuration of $N_{C10}$, $N_{C11}$ and $N_{C12}$ is identical in the controlling leg to that of the logic input devices $N_{30}$, $N_{31}$ and $N_{32}$ of the controlled leg. The referenece voltage $V_{REF1}$ is selected to be the less than fully off input voltage which will cause leakage current in the complex logic device with the appropriate P-channel devices being on.

A second current mirror to compensate for the P-channel device leakage includes a controlled leg drive device $N_{C20}$ connected between voltage source $V_2$ and the output terminal $V_{O30}$ and a controlling leg drive device $N_{C21}$ having its source connected to $V_2$ and its gate and drain connected to the equivalent device configuration of the P-channel input portion of the complex logic gate. This configuration includes serially connected P-channel devices $P_{C20}$ and $P_{C21}$ connected in parallel with the P-channel device $P_{C22}$ between the voltage source $V_1$ and the drain of the N-channel device $N_{C21}$. The gates of $P_{C20}$, $P_{C21}$ and $P_{C22}$ are connected to a second reference voltage source $V_{REF2}$ which is the less than fully off signal which will produce leakage in the P-channel devices of the complex logic gate. The configuration of $P_{C20}$, $P_{C21}$ and $P_{C22}$ is identical to that of $P_{30}$, $P_{31}$ and $P_{32}$ of the complex logic gate. Thus, it can be seen that the pair of current compensation current mirrors provide leakage current for the worst condition wherein all of the P-channel devices or all of the N-channel devices of the complex logic gate are providing leakage current. It can also be seen that the compensation scheme using current mirrors at appropriate reference voltages can be used for serial connected as well as parallel connected devices in complementary inverting logic gates. It should also be noted that the complex logic gate of FIG. 6A does not use pull-up or pull-down devices, but each of the devices are responsive to logic input signals.

Figures 6B, 7:
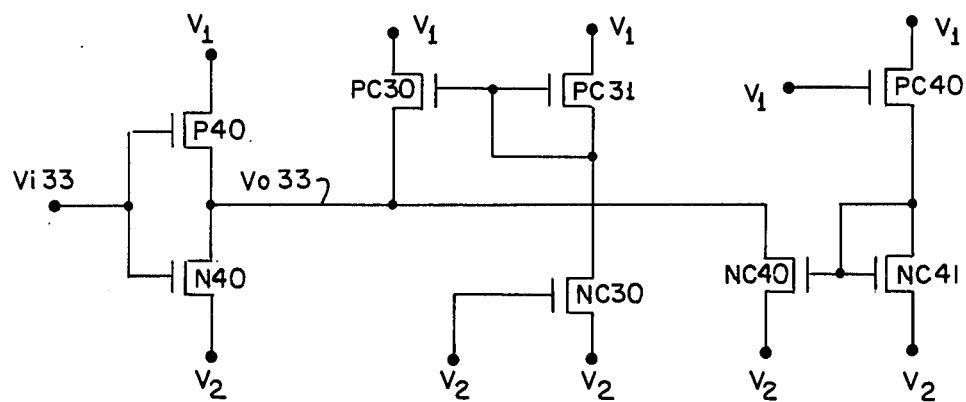
FIG. 7 is a schematic of an inverter compensated for high temperature operation incorporating the principles of the present invention.

The least complex inverting logic gate to which the present compensation scheme is applicable is illustrated in FIG. 7 as a complementary insulated gate field effect transistor inverter including enhancement transistors $P_{40}$ and $N_{40}$ connected in series between the pair of voltage supplies $V_1$ and $V_2$. Their gates are connected to receive the logic input signal $V_{i33}$ and provide an output signal $V_{O33}$. As with the previous examples, the input logic signal $V_{i33}$ may not be sufficient to turn off the complementary device when the desired device is on and thereby produces leakage current.

A pair of compensating circuits are provided for leakage of the N-channel device $N_{40}$ and the P-channel device $P_{40}$. These include a current mirror for the N-channel device $N_{40}$ having a controlled leg P-channel drive device $P_{C30}$ connected between the voltage source $V_1$ and the output $V_{C33}$ and a controlling leg P-channel drive device $P_{C31}$ and N-channel device $N_{C30}$ connected in series between a pair of supply voltages $V_1$ and $V_2$. The gate of $P_{C31}$ is connected to its drain and the gate of $N_{C30}$ is connected to the voltage supply $V_2$. The P-channel compensating circuit includes a controlled leg drive device $N_{C40}$ connected between the voltage supply $V_2$ and the output gate $V_{O33}$ and a controlling leg having drive $N_{C41}$ and load device $P_{C40}$ connected in series between the voltage supplies $V_2$ and $V_1$. The gate of $N_{C41}$ is connected to its drain and the gate of $P_{C40}$ is connected to voltage supply $V_1$.

By connecting the load device of the controlling legs to the respective voltage supplies, the current compensation circuits do not come into play until the load devices of the controlling legs, namely $N_{C30}$ and $P_{C40}$ enter their depletion mode. These are enhancement devices and at a high enough temperature will become depletion devices. Once this temperature is reached, the appropriate device in the inverter $P_{40}$ and $N_{40}$ will also be in depletion mode producing leakage current. Thus, the circuit of FIG. 7 is designed specifically for current compensation at raised temperatures versus current compensation of a inverting logic device wherein one of the devices is less than fully off because of an input logic signal not being of the appropriate value.

It should be noted that the reference voltage is provided on the compensating circuit load devices $P_{C40}$ and $N_{C30}$ may be the expected less than fully off voltage signals and therefore it will operate as the previously described devices. It should also be noted that any of the other circuits may have the references voltage provided to the gate of the load devices in the controlling leg to a voltage source supply such that they operate only as high temperature compensation. Thus, the current compensation of the present system may be used for compensating for input devices entering a depletion mode or for them not being fully off in response to a less than fully off input logic signal.

It is evident from the detailed description of the invention that the objects of the invention are attained in that a current compensating circuit is provided for an output logic gate. Although the present invention has been described and illustrated in detail, it is to be clearly understood that the same is by way of illustration and example only and is not to be taken by way of limitation. The transistor which forms the logic gates and have leakage current may be complementary JFETS and bipolar in addition to the illustrated CIGFETS. The spirit and scope of the invention are to be limited only by the terms of the appended claims.

What is claimed is:

1. A logic circuit comprising:
   a first logic gate means comprising a plurality of inputs requiring all the inputs to have the same first input logic state for the output to switch from a first to a second output logic state;
   a second logic gate means having a plurality of input devices responsive to respective inputs and requiring each of their respective inputs to have the same second input logic state for the output to switch from a third to a fourth output logic state;
   said output of said first logic gate means being connected to one of the inputs of said second logic means and said first output logic state representing said second input logic state;
   current means connected to said second logic gate means output for determining leakage current created by one of said first logic gate's input having a first input logic state which produces an output sufficient to create a leakage current at said second logic gate means output and providing a compensating current responsive to the determined leakage current and being sufficient to compensate for said leakage current.

2. A logic circuit according to claim 1 wherein said current means provides a current sufficient to compensate for leakage current produced when each of said second logic gate means' inputs has an input signal sufficient to create a leakage current.

3. A logic circuit according to claim 1 wherein said current means includes a current mirror means having a controlled and a controlling leg with interconnected drive devices. said controlled leg includes [a]said plurality of second logic gate means input devices connected as loads in series with a respective one of said drive devices and said controlling leg includes a plurality of control devices connected as loads in series with another one of said respective drive devices and; includes reference means connected to said control devices for applying a voltage to said control devices equivalent to said input signal sufficient to create a leakage current whereby said current mirror means provides a current sufficient to compensate for leakage current produced when each of said second logic gate means' inputs have an input signal sufficient to create a leakage current.

4. A logic gate comprising:
   a plurality of input means connected in parallel between an output of a logic gate and a first voltage source for creating a first output logic voltage at the output of said logic gate if any of said input means is on in response to a first input logic signal at its input;
   a pull means connected between said output and a second voltage source for creating a second output logic voltage at said output when all said input means are off in response to a second input logic signal at each input; and
   a current means separate from said pull means and connected to said output for determining and providing a sufficient current to compensate for leakage current created by said plurality of input means not being fully off in response to a second input logic signal at said inputs of said input means.

5. A logic gate according to claim 4 wherein said current means provides a current sufficient to compensate for leakage current created when all of said input means are less than fully off in response to said second input logic signals at their inputs.

6. A logic current according to claim 4 wherein said current means includes a current mirror means having a controlled and a controlling leg with interconnected drive devices, said controlled leg includes said plurality of parallel connected input means connected as loads in series with a respective one of said drive devices, and said controlling leg includes a plurality of parallel connected control devices connected as loads in series with another one of said respective drive devices; and includes a reference means connected to said control devices for applying to all said control devices a voltage equivalent to said less input signal whereby said current mirror means provides a current sufficient to compensate for leakage current created when all of said input means are less than fully off in response to said second input logic signals at their inputs.

7. A logic gate array comprising:
a plurality of logic gates each including a plurality of input means connected in parallel between an output of a logic gate and a first voltage source for creating a first output logic voltage at the output of said logic gate if any of said input means is on in response to a first input logic signal at its input, and a pull means connected between said output and a second voltage source for creating a second output logic voltage at said output when all said input means are off in response to a second input signal at each input; and
a current means separate from said pull means and connected to each of said logic gate outputs for determining and Providing a sufficient current to compensate for leakage current created by said plurality of input means in each logic gate not being fully off in response to a second input logic signal at said inputs of said input means.

8. A logic gate array according to claim 7 wherein said current means provides a current to each logic gate sufficient to compensate for leakage current created when all of said input means of each logic gate are less than fully off in response to said second input logic signals at their inputs.

9. A logic gate according to claim 7 wherein said current means includes a current mirror means having a controlling leg and a plurality of controlled legs connected in parallel to said controlling leg with interconnected drive devices, each of said controlled legs includes said plurality of input means of a respective logic gate connected as loads in series with a respective one of said drive devices, said controlling leg includes a plurality of parallel connected control load devices connected as loads in series with another one of said respective drive devices; and includes a reference means connected to said control devices for applying to all said control devices a voltage equivalent to said less input signal whereby said current mirror means provides a current sufficient to compensate for leakage current created when all of said input means are less than fully off in response to said second input logic signals at their inputs.

10. A logic gate array according to claim 9 wherein the number of control load devices equal said number of input devices in one of said logic gates and each of said control load devices and said input means have the same current capacity.

11. A logic gate array according to claim 9 wherein each of said control load devices and said input means have the same current capacity, and the ratio of the current capacity of said drive device in said controlling leg to the current capacity of said drive device in each of said controlled legs is equal to the ratio of the number of control load devices to the number of input means of the respective logic gate.

12. A logic gate array according to claim 7 wherein said logic gates are NOR gates.

13. A logic gate array according to claim 7 wherein said logic gates are NAND gates.

14. A logic array comprising:
a plurality of first logic gates means each having a plurality of inputs and requiring all the inputs to have the same first input logic state for an output of said first logic gate means to switch from a first to a second output logic state;
a plurality of second logic gate means each having a plurality of input devices responsive to respective inputs and requiring each of their respective inputs to have the same second input logic state for an output of said second logic gate means to switch from a third to a fourth output logic state;
said output of said first logic gate means being connected to one of said inputs of said second logic gate means and said first output logic state representing said second input logic state;
a current means connected to each of said second logic gate means output for determining leakage current created by one of said first logic gate's input having a first input logic state which produces an output sufficient to create a leakage current at said second logic gate means output and providing a compensating current responsive to the determined leakage current and being sufficient to compensate for said leakage current.

15. A logic gate according to claim 14 wherein said current means includes a current mirror having a controlling leg and a plurality of controlled legs connected in parallel to said controlling leg with interconnected drive devices, each of said controlled legs includes said plurality of input devices of a respective second logic gate connected as loads in series with a respective one of said drive devices; said controlling leg includes a plurality of parallel connected control load devices connected as loads in series with another one of said respective drive devices; and includes a reference means connected to said control devices for applying to all said control devices a voltage equivalent to said input signal whereby said current mirror means provides a current sufficient to compensate for leakage current created when all of said input devices are less than fully off.

16. A logic array according to claim 15 wherein the number of control load devices equal the number of input devices in one of said second logic gates and each of said control load devices and said input devices have the same current capacity.

17. A logic array according to claim 15 wherein each of said control load devices and said input devices have the same current capacity, and the ratio of the current capacity of said drive device in said controlling leg to the current capacity of said drive device in each of said controlled leg is equal to the ratio of the number of control load devices to the number of input devices of the respective logic gate.

18. A logic array according to claim 14 wherein said first and second logic gates are NOR gates.

19. A logic array according to claim 14 wherein said first and second logic gates and NAND gates.

20. An inverting logic gate having a plurality of inputs and an output comprising:
   a plurality of first transistors, each being of a first conductivity type, having a pair of terminals connected in series between a first voltage source and said output and a control terminal connected to a respective input for creating a first output logic voltage at said output if all of said first transistors are on in response to a first input logic signal at their control terminal;
   a second transistor of a second conductivity type having a pair of terminals connected between a second voltage source and said output and a control terminal connected to an input for creating a second output logic voltage at said output in response to a second input logic signal at its control terminal;
   current means connected to said output for determining leakage current created by all of said first transistors not being fully off in response to said second input logic signal at their control terminal and said first input logic signal at said control terminal of said second transistor and providing a compensating current responsive to the determined leakage current and being sufficient to compensate for said leakage current.

21. An inverting logic gate according to claim 20 wherein said current means includes a current mirror having a controlled leg and a controlling leg with interconnected drive transistors, said controlled leg includes said plurality of first transistors connected as loads in series with a respective one of said drive transistors, said controlling leg includes a plurality of series connected first conductivity type transistors connected as control loads in series with another one of said respective drive transistors; and includes a reference means connected to said control loads for applying to all of said control loads a voltage equivalent to said less input signal whereby said current mirror means provides a current sufficient to compensate for leakage current created when all of said first transistors are less than fully off in response to said second input logic signals.

22. An inverting logic gate according to claim 21 including a third transistor of said first conductivity type having a pair of terminals connected in parallel to a pair of terminals of a first transistor and a control terminal connected to an input and said controlling leg of said current mirror includes a control load transistor of said first conductivity type connected in parallel with one of the other control devices.

23. A logic gate for use at high temperature having an input and an output comprising:
   at least a first logic enhancement mode field effect transistor of a first conductivity type having a source and a drain connected between a first voltage source and a logic gate output and a gate connected to logic gate input;
   at least a second logic enhancement mode field effect transistor of a second conductivity type having a source and drain connected between a second voltage source and said output and a gate;
   a first complementary field effect transistor current mirror having controlling and controlled legs connected between said first and second voltage sources with interconnected drive transistors, a first controlling enhancement mode field effect transistor of said first conductivity type having its source-drain path connected in said controlling leg in series with a respective one of said drive transistors and a gate connected to said first voltage source and said first logic transistor having its source drain path connected in said controlled leg in series with another one of said respective drive transistors, said first current mirror providing compensation current when said first logic and controlling transistors become depletion mode devices.

24. A logic gate according to claim 23 including a second complementary field effect transistor current mirror having controlling and controlled legs connected between said first and second voltage sources with interconnected drive transistors, a second controlling enhancement mode field effect transistor of said second conductivity type having its source drain path connected in said controlling leg in series with a respective one of said drive transistors and a gate connected to said second voltage source and said second logic transistor having its source drain path connected in said controlled leg in series with another one of said respective drive transistors, said second current mirror providing compensation current when said second logic and controlling transistors become depletion mode devices.

25. A logic gate according to claim 23 wherein said gate of said second logic transistor is connected to said input.

26. A logic gate according to claim 23 wherein said gate of said second logic transistor is connected to a voltage source.

27. A logic gate according to claim 23 including a third logic enhancement mode field effect transistor of said first conductivity type connected in parallel with said first logic transistor and having a gate connected to a second logic input, and wherein said first current mirror includes a second controlling enhancement mode field effect transistor of said first conductivity type connected in parallel to said first controlling transistor and having a gate connected to said first voltage source.

28. A logic gate according to claim 23 including a third logic enhancement mode field effect transistor of said first conductivity type connected in series with said first logic transistor and having a gate connected to a second logic input, and wherein said first current mirror includes a second controlling enhancement mode field effect transistor of said first conductivity type connected in series with said first controlling transistor and having a gate connected to said first voltage source.

29. In a logic gate having a plurality of inputs and an output;
   a plurality of complementary logic transistors connected between said output and a pair of voltage sources to perform a logic function, said inputs being connected at least to a control terminal of a first plurality of logic transistors of a first conductivity type in a first logic configuration to control said function in response to a logic signal inputs, the improvement comprising current compensation means connected to said output for providing current to compensate for leakage current created by at least some of said first plurality of logic transistors not being fully off in response to an input logic signal less than the logic signal needed to turn them off, said compensation means includes a first current mirror of complementary transistors having controlling and controlled legs with interconnected drive transistors, said plurality of first transistors being connected in said controlled leg of said first current mirror in series with a respective one of said drive transistors, and a second plurality of first conductivity type transistors connected in said first logic configuration in said controlling leg of said first current mirror in series with another one of said respective load transistors: and first reference means connected to control terminals of said second plurality of transistors for applying a voltage equivalent to said less input logic signal to all said control terminals of said second plurality of transistors.

30. A logic gate according to claim 29 wherein said first logic configuration are parallel connected transistors.

31. A logic gate according to claim 29 wherein said first logic configuration are series connected transistors.

32. A logic gate according to claim 29 wherein said first logic configuration includes parallel and series connected transistors.

33. A logic gate according to claim 29 wherein inputs are also connected to a control terminal of a third plurality of transistors of a second conductivity type in a second logic configuration and said current compensation means includes a second current mirror having complementary transistor controlling and controlled legs with interconnected drive transistors, said third plurality of transistors being connected in said controlled leg of said second current mirror in series with a respective one of said drive transistors and fourth plurality of second conductivity type transistors connected in said second logic configuration in said controlling leg of said second current mirror in series with another one of said respective drive transistors, and second reference means connected to control terminals of said fourth plurality of transistors for applying a voltage equivalent to an input logic signal voltage less than needed to turn said third plurality of transistors fully off.

34. A complementary inverting logic gate having an input and an output comprising:

at least a first logic transistor of a first conductivity type connected between a first voltage source and a logic gate output and having a control terminal connected to logic gate input;

at least a second logic transistor of a second conductivity type connected between a second voltage source and said output and having a control terminal connected to said logic gate input;

a first complementary transistor current mirror having controlling and controlled legs connected between said first and second voltage sources with interconnected drive transistors, a first controlling transistor of said first conductivity type connected in said controlling leg in series with a respective one of said drive transistors and having a control terminal, and said first logic transistor being connected in said controlled leg of said first current mirror in series with another one of said respective drive transistors:

a second complementary transistor current mirror having controlling and controlled legs connected between said first and second voltage sources with interconnected drive transistors, a second controlling transistor of said second conductivity type connected in said controlling leg in series with a respective one of said drive transistors and having a control terminal, and said second logic transistor being connected in said controlled leg of said second current mirror in series with another one of said respective drive transistor;

a first reference means connected to said control terminal of said first controlling transistor for applying a first voltage equivalent to a first logic signal less than a logic signal capable of turning said first logic transistor fully off; and a second reference means connected to said control terminal of said second controlling transistor for applying a second reference voltage equivalent to a second logic signal less than a logic signal capable of turning said second logic transistor fully off.

* * * * *